(12) United States Patent
Lohmann et al.

(10) Patent No.: US 12,264,867 B2  
(45) Date of Patent: Apr. 1, 2025

(54) CRYOSTAT SOCKET FOR HOLDING AN ION TRAP DEVICE MOUNTED ON A SUBSTRATE IN A CRYOSTAT

(71) Applicant: Infineon Technologies Austria AG, Villach (AT)

(72) Inventors: Günther Lohmann, Atting (DE); Ralf Otremba, Kaufbeuren (DE); Josef Höglauer, Kirchheim-Heimstetten (DE); Clemens Rössler, Villach (AT); Silke Katharina Auchter, Villach (AT)

(73) Assignee: Infineon Technologies Austria AG, Villach (AT)

( * ) Notice: Subject to any disclaimer, the term of this patent is extended or adjusted under 35 U.S.C. 154(b) by 207 days.

(21) Appl. No.: 17/990,829

(22) Filed: Nov. 21, 2022

(65) Prior Publication Data
US 2023/0168023 A1    Jun. 1, 2023

(30) Foreign Application Priority Data
Nov. 30, 2021    (EP) .................................... 21211216

(51) Int. Cl.
F28F 7/00    (2006.01)
F25D 19/00    (2006.01)

(52) U.S. Cl.
CPC .................................. *F25D 19/006* (2013.01)

(58) Field of Classification Search
CPC ...................................................... F28D 19/006
USPC .......................................................... 165/80.4
See application file for complete search history.

(56) References Cited

FOREIGN PATENT DOCUMENTS

EP            3792956 A1      3/2021
JP        20120086236 A  *   8/2012

* cited by examiner

*Primary Examiner* — Davis D Hwu
(74) *Attorney, Agent, or Firm* — Murphy, Bilak & Homiller, PLLC

(57) ABSTRACT

A cryostat socket for holding an ion trap device mounted on a substrate in a cryostat includes a housing frame provided for pre-assembly in the cryostat. A pin insert is arranged in the housing frame. The pin insert includes a base plate and contact pins. The contact pins are arranged in an array. A housing cover has a receptacle for the substrate. The housing cover, when assembled with the housing frame, exerts a compressive force on a front side of the substrate by which a rear side of the substrate is pressed onto the contact pins.

15 Claims, 6 Drawing Sheets

CRYOSTAT SOCKET FOR HOLDING AN ION TRAP DEVICE MOUNTED ON A SUBSTRATE IN A CRYOSTAT

TECHNICAL FIELD

This disclosure relates generally to the field of ion traps, and in particular to ion traps for quantum computing installed in a cryogenic environment.

BACKGROUND

Trapped ions are one of the most promising candidates for use as qubits (quantum bits) in quantum computers since they can be trapped with long lifetimes in a scalable array by virtue of electromagnetic fields. Presently, the most advanced ion traps can control about 50 qubits individually and can maintain up to 16 qubits in a fully entangled state. Future quantum computers will need to increase the number of controllable qubits to more than 100 or even 1000 to outperform classical supercomputers. Further, the number of ions used for each qubit will in future be raised to about 6 to 100 ions in order to allow for more efficient error-correction during quantum computing.

To minimize the interference on the ions, the ion trap device is operated in a cryostat at low temperatures (e.g. equal to or lower than 10K) in an ultra-high vacuum. To this end, the ion trap is mounted to a cryostat socket. Easy and precise mounting of the ion trap device in the cryostat is important. Further, a quick exchange of the ion trap device is desired. In many closed-cycle cryostats (also known in the art as dry cryostats), the sample (i.e. the ion trap device) needs to be mounted from below, which makes mounting and replacing the ion trap more difficult in practice. At the same time, the cryostat socket should allow good thermal contact and easy optical access to the ion trap device.

SUMMARY

According to an aspect of the disclosure, a cryostat socket for holding an ion trap device mounted on a substrate in a cryostat comprises a housing frame provided for pre-assembly in the cryostat. A spring pin insert is arranged in the housing frame, the spring pin insert comprising a base plate and contact pins resiliently received in the base plate, the contact pins being arranged in an array. The cryostat socket further includes a housing cover having a receptacle for the substrate, wherein the housing cover, when assembled with the housing frame, exerts a compressive force on the front side of the substrate, by which the rear side of the substrate is pressed onto the contact pins.

According to another aspect of the disclosure, a method of mounting an ion trap device in a cryostat is described. The ion trap device is mounted on a substrate, and a housing frame of a cryostat socket for holding the ion trap device is pre-assembled in the cryostat. The method comprises placing the substrate with the ion trap device mounted thereon into a housing cover of the cryostat socket, the housing cover having a receptacle for the substrate. The method further comprises assembling the housing cover with the housing frame, thereby exerting a compressive force on a front side of the substrate by which a rear side of the substrate is pressed onto contact pins resiliently received in a base plate of a spring pin insert arranged in the housing frame.

BRIEF DESCRIPTION OF THE DRAWINGS

Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

The words "over" or "on" or "beneath" with regard to a part, element or material layer formed or located or disposed or arranged or placed "over" or "on" or "beneath" a surface may be used herein to mean that the part, element or material layer be located (e.g. placed, formed, arranged, disposed, placed, etc.) "directly on" or "directly under", e.g. in direct contact with, the implied surface. The word "over" or "on" or "beneath" used with regard to a part, element or material layer formed or located or disposed or arranged or placed "over" or "on" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
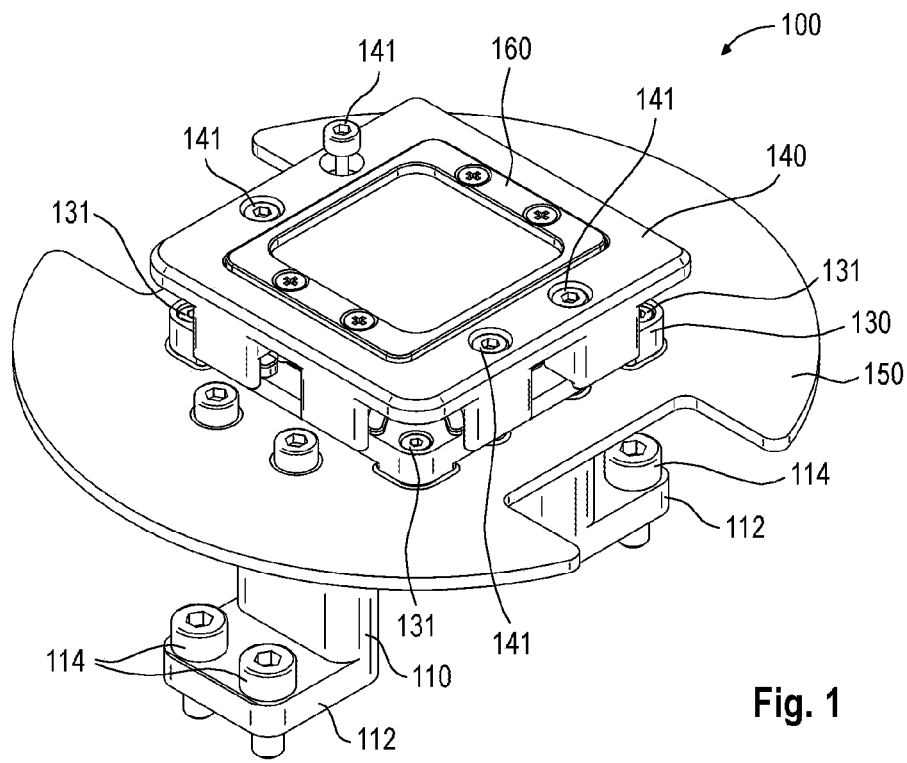
FIG. 1 is a perspective top view of an exemplary cryostat socket.
Figure 2:
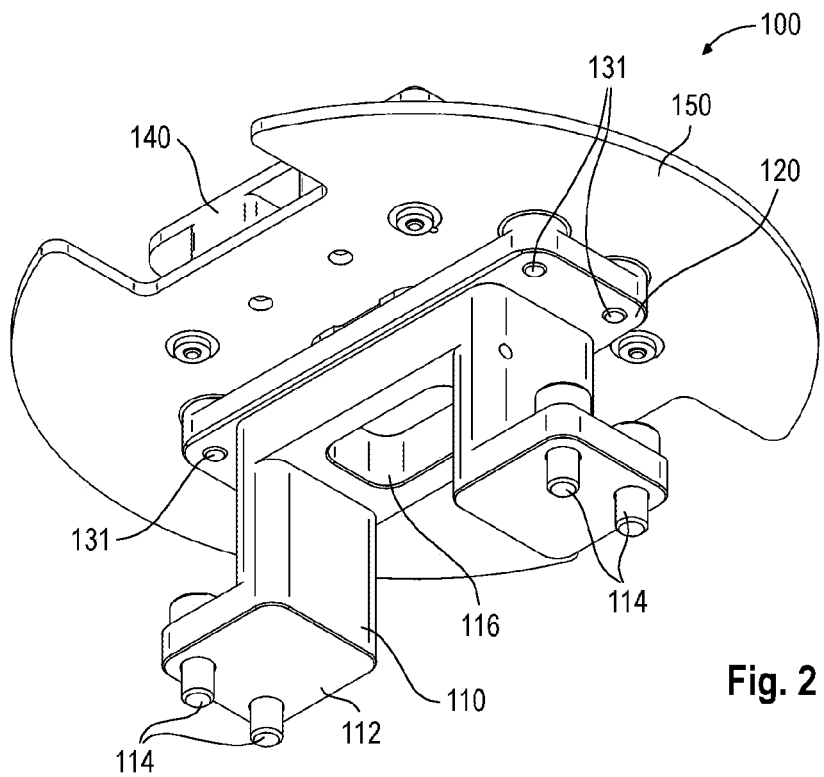
FIG. 2 is a perspective bottom view of the exemplary cryostat socket of FIG. 1.

FIGS. 1 and 2 illustrate an exemplary cryostat socket 100 configured to hold an ion trap device mounted on a substrate (not shown) in a cryostat.

The cryostat socket 100 can be used as a sample holder for a variety of cryostats known in the art, in particular of so-called closed-cycle cryostats. Such cryostats are also known as dry cryostats or PTRs (pulse-tube refrigerators).

Such cryostats provide for a cooled mounting platform (not shown) on which the cryostat socket 100 can be mounted. To this end, the cryostat socket 100 may be provided with a mounting bracket 110. The mounting bracket 110 may, e.g., be U-shaped and may, e.g., be equipped with one or more base sections 112. The base sections 112 are configured to be fastened to the mounting platform of the cryostat. For example, screw connections 114 may be used for fastening the mounting bracket 110 to the mounting platform of the cryostat. The mounting bracket 110 may, e.g., have an opening 116 in a part bridging the base sections 112. The mounting bracket 110 may, e.g., be of different kind and/or shape such as, e.g. a post or a pedestal etc., or may be omitted. The mounting bracket 110 may serve as a spacer to set a desired distance between the cooled mounting platform (not shown) of the cryostat and the ion trap device to be mounted to the cryostat socket 100.

The cryostat socket 100 further comprises a housing frame 130 and a housing cover 140. As will be described in greater detail further below, the housing frame 130 and the housing cover 140 define a measurement cell (or measurement chamber). The housing frame 130 is, e.g., detachably connected to the mounting bracket 110. For example, an (optional) back-frame 120 may serve as an intermediate structure to fasten the housing frame 130 to the mounting bracket 110. In other examples, the housing frame 130 and the mounting bracket 110 are integral, i.e. of a single piece.

More specifically, as shown in FIGS. 1 and 2, the back-frame 120 may be detachably secured to the mounting bracket 110, and the housing frame 130 may be detachably secured to the back-frame 120. By way of example, FIGS. 1 and 2 illustrate screw connections 131 for fixing the housing frame 130 to the back-frame 120.

The housing cover 140 may be detachably secured to, e.g., the housing frame 130 by, e.g., screw connections 141. The housing cover 140 may have a top side opening which may, in this example, be covered by a framed mesh 160.

Further, the cryostat socket 100 may be equipped with an optional application board 150. The application board 150 may carry electronic circuitry (not shown) for driving the ion trap device (which is accommodated in the housing formed by the assembled housing frame 130 and housing cover 140 and is therefore not visible in FIGS. 1 and 2).

For loading or unloading of an ion trap device in the cryostat, the (optional) mounting bracket 110, the (optional) back-frame 120, the (optional) application board 150 and the housing frame 130 are pre-assembled and remain assembled in the cryostat during loading or unloading. Typically, these elements of the cryostat socket 100 are pre-assembled in a top-down orientation, i.e. the mounting bracket 110 is suspended from the mounting platform (not shown) of the cryostat. As will be described in further detail below, the housing cover 140 is removed and used as a tray to insert the substrate on which the ion trap device is mounted into the housing frame 130.

Figure 3:
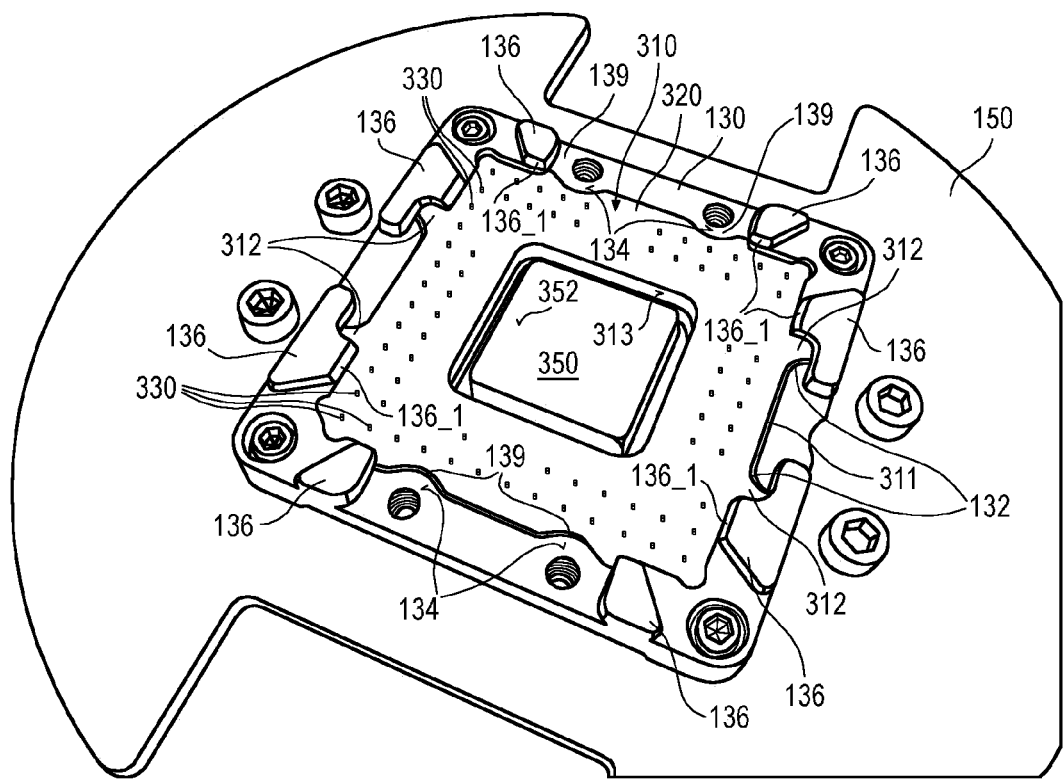
FIG. 3 is a perspective partial top view of the exemplary cryostat socket of FIGS. 1 and 2 with detached housing cover.

FIG. 3 illustrates the exemplary cryostat socket 100 with detached housing cover 140. The substrate-mounted ion trap device is not yet inserted in the housing frame 130. A spring pin insert 310 is arranged in the housing frame 130. The spring pin insert 310 includes a base plate 320 and contact pins 330 resiliently received in the base plate 320. As apparent from FIG. 3, the contact pins 330 are arranged in an array.

The cryostat socket 100 may comprise a cooling stamp 350. The cooling stamp 350 includes an upper abutment surface 352 for contact with the rear side of the substrate (not shown). The housing frame 130 may be penetrated by the cooling stamp 350. Further, the spring pin insert 310 (or, more specifically, the base plate 320 thereof) may comprise an opening, and the cooling stamp 350 may pass through this opening. As exemplarily illustrated herein, the cooling stamp 350 may, e.g., not be in direct contact with the housing frame 130.

The cooling stamp 350 may be pre-mountable in the cryostat. For example, the cooling stamp 350 may be an integral part of the back-frame 120. In this case, the cooling stamp 350 may be mounted together with the back-frame 120 on the mounting bracket 110. In other examples the cooling stamp 350 may be directly mounted to or be an integral part of the mounting bracket 110. Further, it is possible that the cooling stamp 350 is directly mounted to the mounting platform (not shown) on which the cryostat socket 100 is assembled. In this case, the cooling stamp 350 may penetrate the opening 116 of the mounting bracket 110. In still other examples (not shown), the cooling stamp 350 may be an integral part of the housing frame 130.

The lateral position of the spring pin insert 310 within the housing frame 130 is fixed. For instance, the spring pin insert 310 may be fitted into the housing frame 130 to be held in a laterally fixed position. Additionally or alternatively, the spring pin insert 310 may be secured by other fastening means (clamps, screws, etc.) to the housing frame. To this end, the spring pin insert 310 may, e.g., have an outline 311 which matches at least partially to an outline of the inner edge of the housing frame 130. This outline 311 may, e.g., be provided with projections 312 that engage in form-complementary recesses 132 at the inner edge of the housing frame 130.

The spring pin insert 310 may be provided with an opening 313. The opening 313 may be provided in a central part of the spring pin insert 310. The opening 313 allows the cooling stamp 350 to expose its abutment surface 352 to the rear side of the substrate 410 (see FIG. 4). In other examples, the spring pin insert 310 may be a continuous plate (i.e. without an opening 313) and may, e.g., contact the abutment surface 352 of the cooling stamp 350 at its rear side. In this case, however, the transfer of heat would need to pass through the spring pin insert 310 (or, more specifically, through the base plate 320 of the spring pin insert 310).

Figure 4:
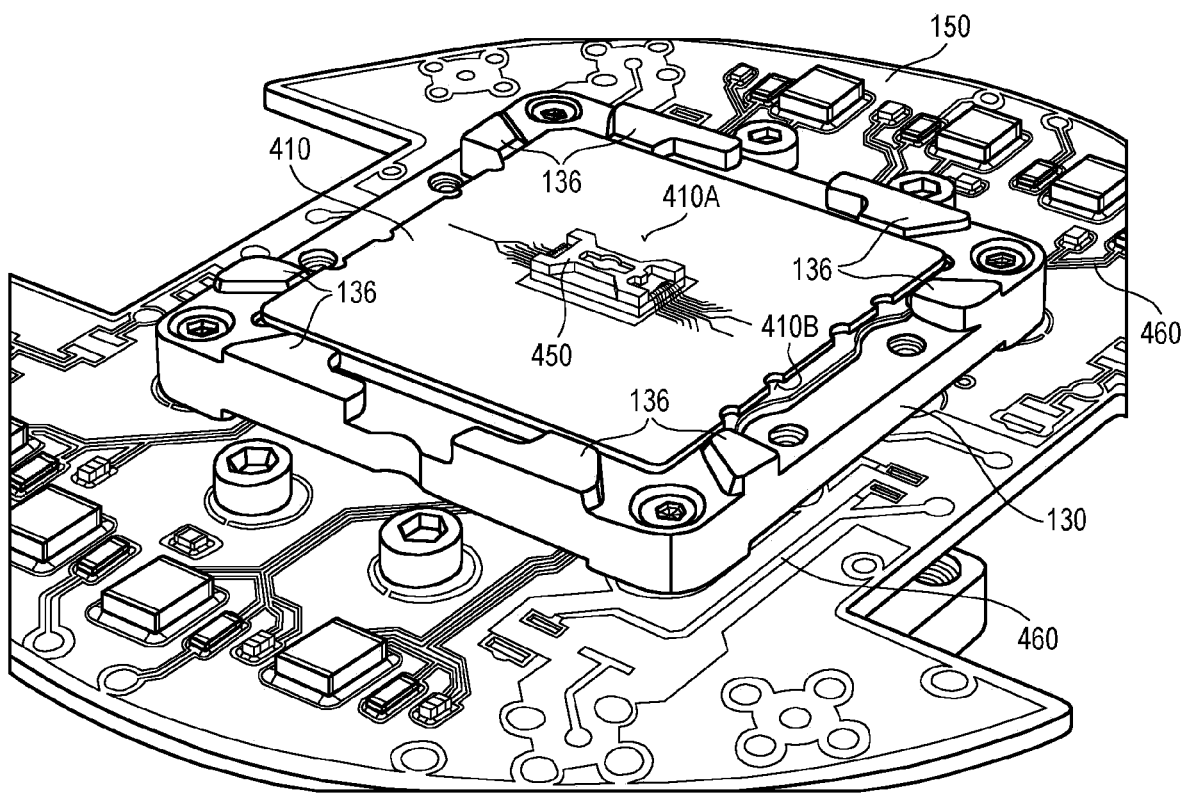
FIG. 4 is a perspective partial top of the exemplary cryostat socket of FIGS. 1 to 3 with detached housing cover and with a substrate having an ion trap device mounted on its front side placed on the housing frame.

In FIG. 4 the substrate 410 is placed in the housing frame 130. The substrate 410 has a front side 410A and a rear side 410B. An ion trap device 450 may, e.g., be mounted on the front side 410A. The rear side 410B of the substrate 410 faces the spring pin insert 310 and the abutment surface 352 of the cooling stamp 350.

In its final position, when the housing cover 140 is assembled with the housing frame 130, the rear side 410B of the substrate 410 may contact the abutment surface 352 of the cooling stamp 350. Further, the rear side 410B of the substrate 410 contacts the contact pins 330. The plane defined by the abutment surface 352 is at a height that ensures that the contact pins 330 are slightly depressed in their spring seats by the substrate 410 when the rear side 410B of the substrate 410 contacts the contact pins 330, ensuring a reliable contact over a wide temperature range. At the same time, the lateral expansion/contraction of the substrate 410 during temperature changes (heating/cooling) can be taken into account by supporting the substrate 410 floating in the lateral direction. In this regard, the contact pins 330 allow the substrate 410 to float (also) in lateral direction relative to the housing frame 130 and relative to the spring pin insert 310. The spring pin insert 310 may be made of a material having similar CTE (coefficient of thermal expansion) as the substrate 410 to reduce lateral displacement between these parts. In particular, the substrate 410 may be made of the same material as the spring pin insert 310.

In one example the substrate 410 is held in its final position (rest position) towards the mounting platform of the cryostat only by the abutment surface 352 of the cooling stamp 350 when the housing cover 140 is assembled with the housing frame 130.

In other examples the housing frame 130 may additionally or exclusively provide for a control of the final position of the substrate 410 towards the mounting platform of the cryostat. To this end, the housing frame 130 may include one or more abutment surfaces 134 for the rear side 410B of the substrate 410.

In one example, the abutment surfaces 134 may be provided by inwardly facing projections 139. In other examples, the housing frame 130 may be provided with a circumferential inner rim (not shown) which may provide for one continuous abutment surface configured to support an outer region of the rear side 410B of the substrate 410.

If the housing frame 130 is provided with one or more abutment surfaces 134 as described above, these abutment surfaces 134 may be in the same plane as the abutment surface 352 of the cooling stamp 350.

The housing frame 130 may, e.g., be provided with one or more stop elements 136. The stop elements 136 are provided with stop surfaces 136_1 facing the edge of the substrate 410 to limit a potential lateral movement of the substrate 410.

The stop surfaces 136_1 of opposing stop elements 136 may be spaced apart by a distance which ensures floating bearing of the substrate 410 in the housing frame 130. To this end, this distance may be a little greater than the corresponding lateral dimension of the substrate 410 to allow for a (small) lateral movement clearance of the substrate 410 in the housing frame 130. This lateral movement clearance should accommodate a CTE mismatch between the substrate 410 and the housing frame 130 to ensure floating bearing of the substrate 410 on the housing frame 130 (e.g. to prevent pinching of the substrate 410 with the housing frame 130).

As shown by way of example in FIG. 4, the application board 150 may carry electrical circuitry and/or electrical components for driving the ion trap device 450. The electrical circuitry/electrical components may be located laterally outside the housing frame 130.

The application board 150 may comprises an electrical wiring for electrically connecting the contact pins 330 of the spring pin insert 310 at their bottom region. To this end, conductive traces 460 on the application board 150 may be routed into the inside of the housing frame 130 and may be connected to contact pins 330 of the spring pin insert 310. The electrical wiring (e.g. conductive traces 460) of the application board 150 may connect the electrical circuitry and/or the electrical components on the application board 150 with the contact pins 330 of the spring pin insert 310. This may be achieved by the resilience of the contact pins 330 or the application board 150 may carry fixed electrical bonds, plugs or connectors (not shown) to provide for electrical contacts in the housing frame 130. It is to be noted that no such bonds, plugs or connectors need to be released (e.g. unsoldered, unplugged or disconnected) when replacing the ion trap device.

For example, the base plate 320 may be of an insulating material which is provided with an array of through-holes. The contact pins 330 may, e.g., each be configured as a spring pin. Such spring pin may be equipped with an internal spring. The spring pins only need to be inserted into the through-holes to ensure the spring-loaded, bottom-to-top contact function of the spring pin insert 310. In order to avoid that the spring pins fall out of the base plate 320 when the housing frame 130 is in its pre-assembled position, the spring pins may, e.g., be press-fitted into the through-holes of the base plate 320.

FIGS. 5 to 8 illustrate the housing cover 140, the housing frame 130, the mounting bracket 110 and the back-frame 120 with the cooling stamp 350 as individual parts, respectively.

Figure 5:
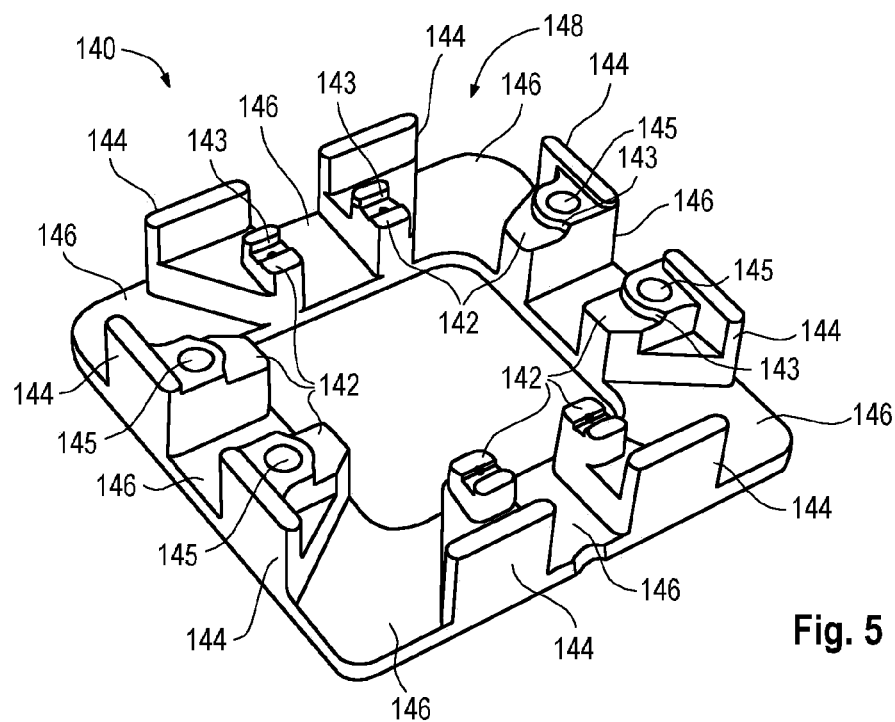
FIG. 5 is a perspective bottom view of an example of a housing cover of the cryostat socket of FIGS. 1 to 4.

In FIG. 5 a perspective bottom view of the housing cover 140 is shown. The housing cover 140 is provided with a receptacle 148 for the substrate 410. The receptacle 148 serves as a holding means for the substrate 410 when the substrate 410 with the ion trap device 450 is loaded into the housing cover 140 and transferred to the pre-assembled part of the cryostat socket 100 for assembly, e.g. overhead assembly (an example of a pre-assembled part of the cryostat socket 100 is shown in FIG. 3).

Further, when the housing cover 140 is assembled with the housing frame 130, the receptacle 148 is configured and used to exert a compressive force on the front side 410A of the substrate 410. By this compressive force the rear side 410B of the substrate 410 is pressed onto the contact pins 330 of the spring pin insert 310. Further, depending on the design of the housing frame 130, the compressive force is also used to optionally press the rear side 410B of the substrate 410 on the abutment surface 352 of the cooling stamp 350 and/or on the one or more abutment surfaces 134 of the housing frame 130.

The compressive force exerted by the housing cover 140 and the opposing force exerted by the contact pins 330 of the spring pin insert 310 (and optionally by the abutment surface 352 of the cooling stamp 350 and/or by the one or more abutment surfaces 134 of the housing frame 130) provide a cryostat socket 100 with stress-decoupled mounting of the ion trap device 450.

The receptacle 148 of the housing cover 140 may be designed in many different ways. Besides its capacity to exert compressive force onto the substrate 410, it should provide for a high degree of lateral optical access to the ion trap device 450.

The receptacle 148 may, e.g., be provided with a plurality of abutment surfaces 142 arranged at a distance from one another circumferentially on the housing cover 140. The compressive force is exerted on the front side 410A of the substrate 410 by the plurality of abutment surfaces 142 when the housing cover 140 is assembled with the housing frame 130, e.g. by tighten the screw connections 141 (see FIG. 1).

For instance, the housing cover 140 may be provided with at least one or two abutment surfaces 142 per 90° circumferential sector of the housing cover 140. In the example shown in FIG. 5, e.g. in total eight abutment surfaces 142 exist that form the receptacle 148 of the housing cover 140.

Each abutment surface 142 may be provided by a wall element 144 of the housing cover 140. The wall elements 144 are separated from each other by cutouts 146 of the wall of the housing cover 140. In one example the housing cover 140 may have a cutout 146 at some or each side of the housing cover 140. Alternatively or in addition, the housing cover 140 may have cutouts 146 at some or each corner region of the housing cover 140. In FIG. 5, cutouts 146 are provided both at the side faces and the corner regions of the housing cover 140. That way, the wall of the housing cover 140 is subdivided by, e.g., eight cutouts 146. The cutouts 146 allow optical access to the ion trap device 145 from some or all side faces and/or corner regions of the cryostat socket 100.

The receptacle 148 may, e.g., further include abutment side faces 143 to control the lateral position of the substrate 410 when placed in the receptacle 148 of the housing cover 140. In the example shown in FIG. 5, such abutment side faces 143 for laterally positioning the substrate 410 are also provided on the wall elements 144 and are formed as vertical steps extending from the horizontal abutment surfaces 142.

The compressive force exerted by the housing cover 140 on the front side 410A of the substrate 410 may be the only force applied to the front side 410A of the substrate 410 to hold the substrate 410 in place when assembled with the housing frame 130. Differently put, the final position of the substrate 410 may be controlled in the assembled state with the housing frame 130 by the abutment surfaces 142 of the wall elements 144 and by the contact pins 330 of the spring pin insert 310 alone. Optionally, further positional control at the rear side 410B of the substrate 410 may be exercised by the abutment surface 352 of the cooling stamp 350 and/or by the one or more abutment surfaces 134 of the housing frame 130.

The housing cover 140 may further provide for effective cooling of the front side 410A of the substrate 410. This front side cooling is (also) achieved by the abutment surfaces 142. To provide for high thermal conductivity, the housing cover 140 may comprise or be made of copper, for example.

In view of these functions, the housing cover 140 may also be referred to as a "front side substrate cooling compression lid".

In other words, the substrate 410 that carries the ion trap device 450 can be easily mounted into the cryostat socket 100 by using the housing cover 140, wherein the housing cover 140, when attached to the housing frame 130, is configured to provide a defined compressive force for electrical contact and (optional) rear side cooling as well as an effective front side cooling of the substrate 410.

Figure 6:
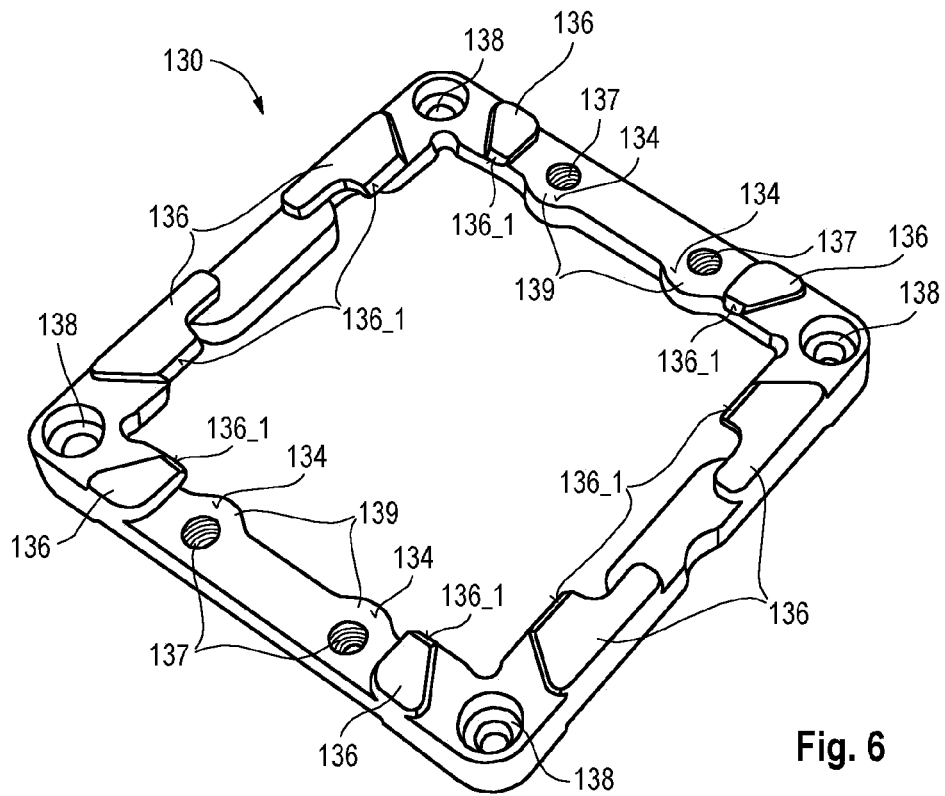
FIG. 6 is a perspective top view of an example of a housing frame of the cryostat socket of FIGS. 1 to 4.
Figure 7:
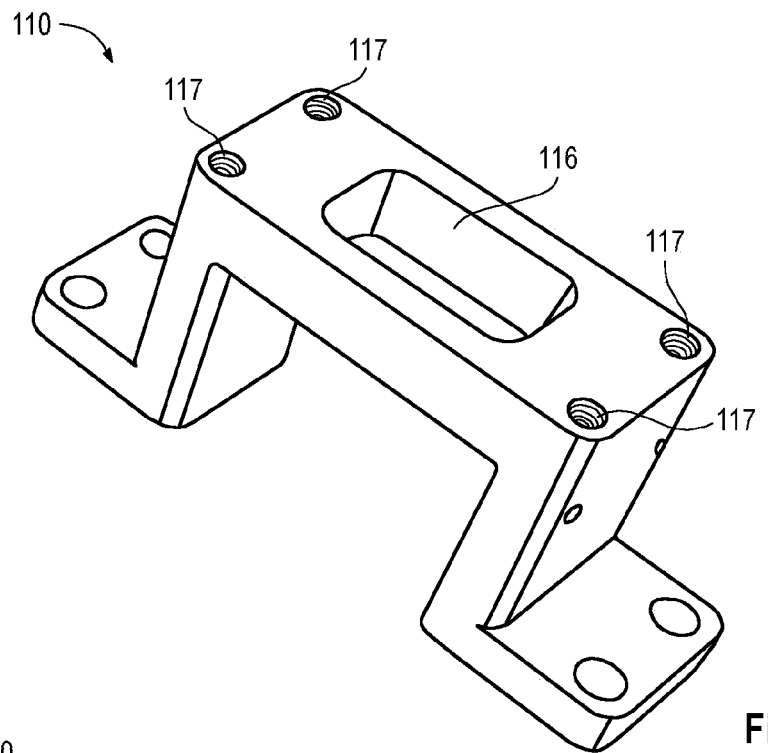
FIG. 7 is a perspective top view of an example of a bracket of the cryostat socket of FIGS. 1 to 4.
Figure 8:
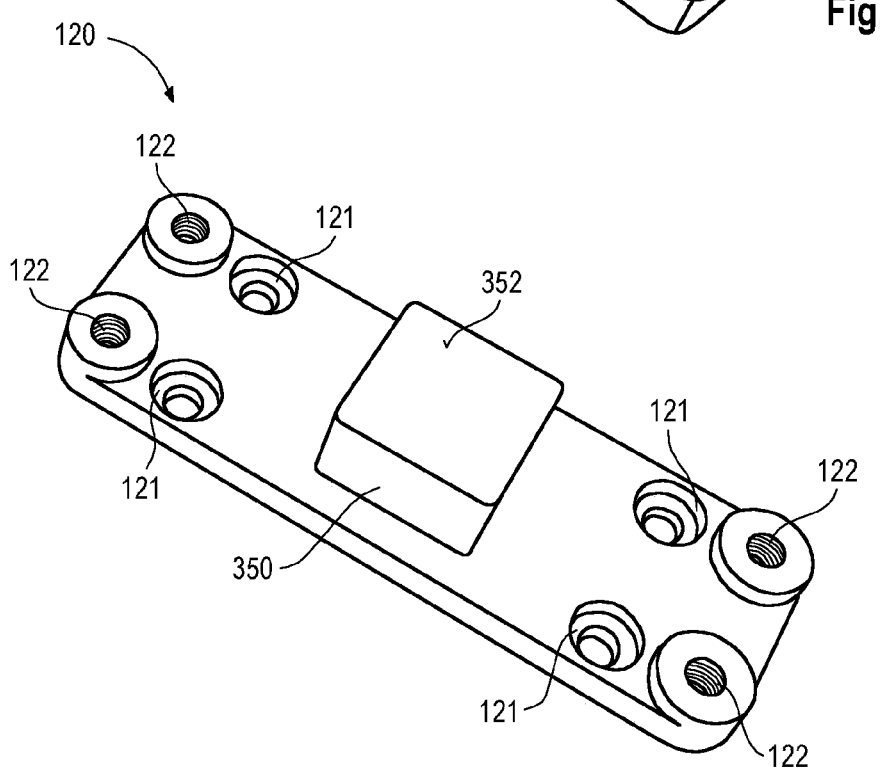
FIG. 8 is a perspective top view of an example of a cooling stamp of the cryostat socket of FIGS. 1 to 4.

Referring to FIG. 6, the housing frame 130 may be provided with threaded holes 137 configured to receive the screw connections 141 passing through-holes 145 in some of the wall elements 144. Holes 138 at the corner regions of the housing frame 130 may be provided to secure the housing frame 130 via detachable connections, e.g. screw connections, to the application board 150. The housing frame 130 may comprise or be made of copper, for example.

The mounting bracket 110 (FIG. 7) may, e.g., be provided with threaded holes 117 or other fastening means which allow to secure the back-frame 120 (FIG. 8) via corresponding fastening means (e.g. holes 121) to the mounting bracket 110. The screw holes 122 or other fastening means of the back-frame 120 may, e.g., serve for assembly of the application board 150. The mounting bracket 110 and the back-frame 120 may comprise or be made of copper, for example.

More generally, the housing cover 140 and/or the housing frame 130 and/or the mounting bracket 110 and/or the back-frame 120 may be connected to one another by releasable connections, in particular screw connections.

The mounting bracket 110 and/or the back-frame 120 and/or the housing frame 130 and/or the housing cover 140 may be plated with a material (e.g. Au, Pt, ITO (indium tin oxide)) that has a high work function for electrons. For example, an Au coating over an Ag coating may be used for one or more of these parts.

Figure 9:
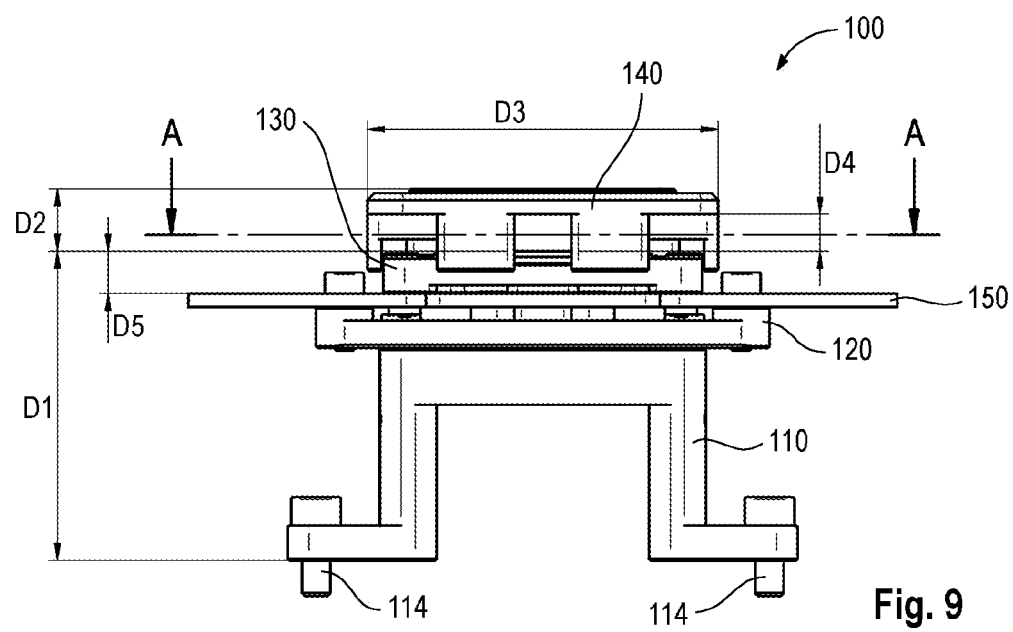
FIG. 9 is a side view of the exemplary cryostat socket of FIGS. 1 to 8.

FIG. 9 shows a to-scale side view of an exemplary cryostat socket 100 when completely assembled. Again, it is to be noted that the installation position is usually upside down, with the mounting bracket 110, the back-frame 120, the application board 150 and the housing frame 130 pre-mounted in the cryostat and with the housing cover 140 with the inserted substrate 410 with ion trap device 450 thereon moved to and attached to the pre-assembled parts of the cryostat socket 100. For example, exemplary dimensions are D1=44 mm and/or D2=8.8 mm and/or D3=50 mm and/or D4=5 mm and/or D5=6 mm.

Figure 10:
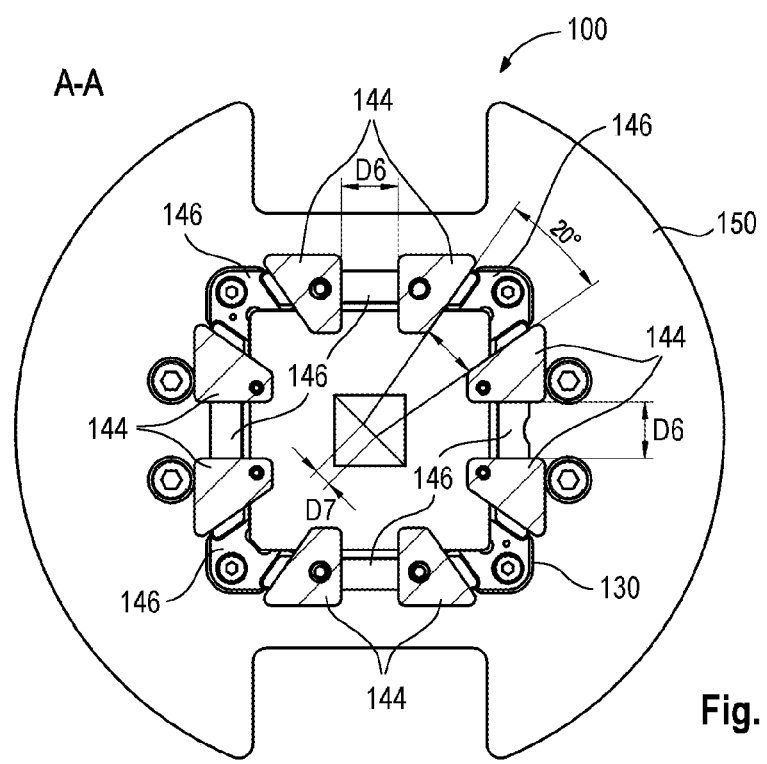
FIG. 10 is a cutaway top view along line A-A of FIG. 9.

Referring to FIG. 10, the edge cutouts 146 of the sidewall of the housing cover 140 allow optical access across an angle of, e.g., 20°. The cutouts 146 at the side faces of the housing cover 140 may, in this example, have a dimension of e.g. D6=8 mm. For example, D7=2.5 mm.

FIGS. 9 and 10 are drawn to scale. Hence, dimensional relationships (shorter as, larger as, same size as), angles and angular relationships can be directly taken from FIGS. 9 and 10 and form a part of the disclosure herein. All dimensions and angles indicated in FIGS. 9 and 10 are exemplary and are disclosed herein also as lower or upper limits of ranges of the respective dimension or angle. Additional exemplary range limits disclosed herein are ±10% or ±30% or ±60% of each of dimension D1 through D7 and the angle of 20° as indicated in FIGS. 9 and 10.

Figure 11:
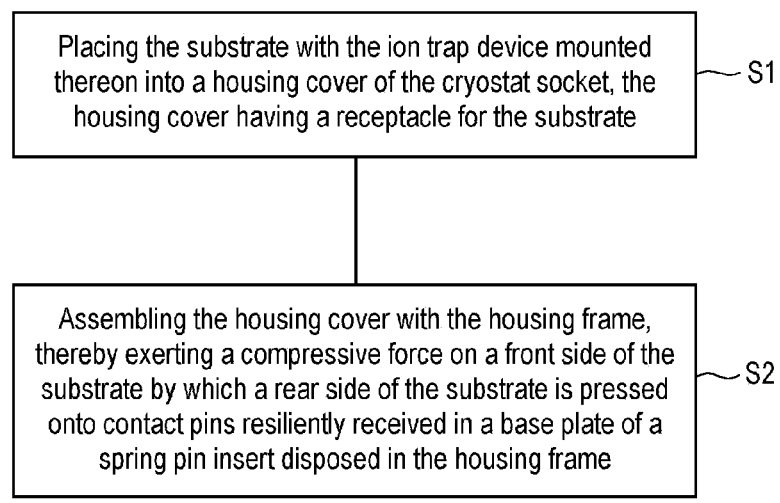
FIG. 11 is a flowchart illustrating an exemplary method of mounting an ion trap device in a cryostat.

Referring to FIG. 11, a method of mounting an ion trap device in a cryostat may include, at S1, placing the substrate with the ion trap device mounted thereon into a housing cover of the cryostat socket, the housing cover having a receptacle for the substrate.

The housing frame of the cryostat socket for holding the ion trap device is already pre-assembled in the cryostat. At S2, the housing cover is assembled with the housing frame. The housing cover may, e.g., be assembled with the housing frame from below. A compressive force is exerted on a front side of the substrate by which a rear side of the substrate is pressed onto contact pins resiliently received in a base plate of a spring pin insert arranged in the housing frame.

The cryostat socket disclosed herein as well as the method of mounting an ion trap device in a cryostat allow a quick and easy exchange of ion trap devices pre-mounted on substrates (e.g. overhead mounting and assembly). In particular, most parts of the cryostat socket can remain in the cryostat, and replacement of an ion trap can be accomplished by simply removing and reattaching the housing cover of the cryostat socket.

The following examples pertain to further aspects of the disclosure:

Example 1 is a cryostat socket for holding an ion trap device mounted on a substrate in a cryostat. The cryostat socket includes a housing frame provided for pre-assembly in the cryostat. A spring pin insert is arranged in the housing frame. The spring pin insert comprises a base plate and contact pins resiliently received in the base plate. The contact pins are arranged in an array. A housing cover has a receptacle for the substrate, wherein the housing cover, when assembled with the housing frame, exerts a compressive force on the front side of the substrate by which the rear side of the substrate is pressed onto the contact pins.

In Example 2, the subject matter of Example 1 can optionally include wherein the receptacle is provided with a plurality of abutment surfaces arranged at a distance from one another circumferentially on the housing cover, the compressive force is exerted on the front side of the substrate via the plurality of abutment surfaces.

In Example 3, the subject matter of Example 2 can optionally include wherein at least one or two abutment surfaces are provided per 90° circumferential sector of the housing cover.

In Example 4, the subject matter of any of the preceding Examples can optionally include wherein the compressive force exerted by the housing cover on the front side of the substrate is the only force applied to the front side of the substrate to hold the substrate in place in the assembled state with the housing frame.

In Example 5, the subject matter of any of the preceding Examples can optionally include wherein the housing cover has a quadrangular or octagonal peripheral shape, and wherein a peripheral wall of the housing cover has a cutout on each of the four or eight sides.

In Example 6, the subject matter of any of the preceding Examples can optionally further include a cooling stamp pre-mountable in the cryostat, wherein the cooling stamp comprises an upper abutment surface for contact with the rear side of the substrate.

In Example 7, the subject matter of Example 6 can optionally include wherein the spring pin insert comprises an opening, the cooling stamp passing through the opening.

In Example 8, the subject matter of any of the preceding Examples can optionally include wherein the housing frame comprises one or more abutment surfaces for the rear side of the substrate.

In Example 9, the subject matter of any of the Examples 6 or 7 and 8 can optionally include wherein the abutment surface of the cooling stamp and the one or more abutment surfaces of the housing frame are in a same plane.

In Example 10, the subject matter of any of the preceding Examples can optionally include wherein the housing frame is provided with one or more stop elements with stop surfaces facing the edge of the substrate to limit potential lateral movement of the substrate.

In Example 11, the subject matter of Example 10 can optionally include wherein the stop surfaces of opposing stop elements are spaced apart by a distance which ensures floating bearing of the substrate on the housing frame.

In Example 12, the subject matter of any of the preceding Examples can optionally include wherein the housing cover is fixable to the housing frame via detachable connections.

In Example 13, the subject matter of any of the preceding Examples can optionally further include an application board located between the housing frame and a bracket pre-mountable on the cryostat, the application board carrying electronic circuitry for driving the ion trap device.

In Example 14, the subject matter of Example 13 can optionally further include wherein the application board comprises an electrical wiring for electrically connecting the contact pins of the spring pin insert.

Example 15 is a method of mounting an ion trap device in a cryostat, wherein the ion trap device is mounted on a substrate and a housing frame of a cryostat socket for holding the ion trap device is pre-assembled in the cryostat, the method comprises placing the substrate with the ion trap device mounted thereon into a housing cover of the cryostat socket, the housing cover having a receptacle for the substrate; and assembling the housing cover with the housing frame, thereby exerting a compressive force on a front side of the substrate by which a rear side of the substrate is pressed onto contact pins resiliently received in a base plate of a spring pin insert arranged in the housing frame.

In Example 16, the subject matter of Example 15 can optionally include wherein the housing cover is assembled with the housing frame from below.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A cryostat socket for holding an ion trap device mounted on a substrate in a cryostat, the cryostat socket comprising:

a housing frame provided for pre-assembly in the cryostat;

a pin insert arranged in the housing frame, the pin insert comprising a base plate and contact pins, the contact pins being arranged in an array; and a housing cover having a receptacle for the substrate, wherein the housing cover, when assembled with the housing frame, exerts a compressive force on a front side of the substrate by which a rear side of the substrate is pressed onto the contact pins.

2. The cryostat socket of claim 1, wherein the receptacle is provided with a plurality of abutment surfaces arranged at a distance from one another circumferentially on the housing cover, and wherein the compressive force is exerted on the front side of the substrate via the plurality of abutment surfaces.

3. The cryostat socket of claim 2, wherein at least one or two abutment surfaces of the plurality of abutment surfaces are provided per 90° circumferential sector of the housing cover.

4. The cryostat socket of claim 1, wherein the compressive force exerted by the housing cover on the front side of the substrate is the only force applied to the front side of the substrate to hold the substrate in place in an assembled state with the housing frame.

5. The cryostat socket of claim 1, wherein the housing cover has a quadrangular peripheral shape with four sides, and wherein a peripheral wall of the housing cover has a cutout on each of the four sides.

6. The cryostat socket of claim 1, wherein the housing cover has an octagonal peripheral shape with eight sides, and wherein a peripheral wall of the housing cover has a cutout on each of the eight sides.

7. The cryostat socket of claim 1, further comprising a cooling stamp pre-mountable in the cryostat, wherein the cooling stamp comprises an upper abutment surface for contact with the rear side of the substrate.

8. The cryostat socket of claim 7, wherein the pin insert comprises an opening, and wherein the cooling stamp passes through the opening.

9. The cryostat socket of claim 7, wherein the housing frame comprises one or more abutment surfaces for the rear side of the substrate, and wherein the upper abutment surface of the cooling stamp and the one or more abutment surfaces of the housing frame are in a same plane.

10. The cryostat socket of claim 1, wherein the housing frame comprises one or more abutment surfaces for the rear side of the substrate.

11. The cryostat socket of claim 1, wherein the housing frame is provided with one or more stop elements with stop surfaces facing the edge of the substrate to limit lateral movement of the substrate.

12. The cryostat socket of claim 11, wherein the stop surfaces of opposing stop elements are spaced apart by a distance which ensures floating bearing of the substrate on the housing frame.

13. The cryostat socket of claim 1, wherein the housing cover is fixable to the housing frame via detachable connections.

14. The cryostat socket of claim 1, further comprising:

an application board located between the housing frame and a bracket pre-mountable on the cryostat, the application board carrying electronic circuitry for driving the ion trap device.

15. The cryostat socket of claim 14, wherein the application board comprises an electrical wiring for electrically connecting the contact pins of the pin insert.

\* \* \* \* \*